(12) United States Patent
Litsyn et al.

(10) Patent No.: US 7,903,468 B2
(45) Date of Patent: Mar. 8, 2011

(54) ADAPTIVE DYNAMIC READING OF FLASH MEMORIES

(75) Inventors: Simon Litsyn, Givat Shmuel (IL); Idan Alrod, Tel Aviv (IL); Eran Sharon, Rishon Lezion (IL)

(73) Assignee: Ramot At Telaviv University Ltd., Tel Aviv (IL)

( * ) Notice: Subject to any disclaimer, the term of this patent is extended or adjusted under 35 U.S.C. 154(b) by 552 days.

(21) Appl. No.: 11/941,945

(22) Filed: Nov. 18, 2007

(65) Prior Publication Data
US 2008/0263265 A1 Oct. 23, 2008

Related U.S. Application Data

(60) Provisional application No. 60/913,299, filed on Apr. 23, 2007.

(51) Int. Cl.
*G11C 16/04* (2006.01)
(52) U.S. Cl. ............ 365/185.24; 365/185.03; 365/185.2
(58) Field of Classification Search ............. 365/185.24, 365/185.2, 185.03
See application file for complete search history.

(56) References Cited

U.S. PATENT DOCUMENTS

| | | | |
|---|---|---|---|
| 5,657,332 A | 8/1997 | Auclair et al. | |
| 6,522,580 B2 | 2/2003 | Chen et al. | |
| 6,751,766 B2 | 6/2004 | Guterman et al. | |
| 2006/0126382 A1* | 6/2006 | Maayan et al. | 365/185.2 |
| 2007/0091677 A1 | 4/2007 | Lasser et al. | |
| 2008/0019182 A1* | 1/2008 | Yanagidaira et al. | 365/185.19 |
| 2008/0077841 A1 | 3/2008 | Gonzalez et al. | |
| 2008/0077842 A1 | 3/2008 | Gonzalez et al. | |
| 2010/0020604 A1* | 1/2010 | Cornwell et al. | 365/185.03 |

FOREIGN PATENT DOCUMENTS
WO WO2008/111058 9/2008

OTHER PUBLICATIONS

A .P .Dempster, N .M .Laird and D .B .Rubin,, Maximum likelihood from incomplete data via the EM algorithm:, Journal of the Royal Statistical Society, vol. 39 No. 1 pp. 1-39 (1977), 1997.
Manfred K. Warmuth and Yoram Singer., "A new parameter estimation method for Geussian mixtures", Mar. 16, 1998.
U.S. Appl. No. 11/808,906, filed Jun. 2008, Eran Sharon et al.

* cited by examiner

*Primary Examiner* — Vu A Le
*Assistant Examiner* — Han Yang
(74) *Attorney, Agent, or Firm* — Mark M. Friedman

(57) ABSTRACT

Each of a plurality of flash memory cells is programmed to a respective one of $L \geq 2$ threshold voltage states within a threshold voltage window. Values of parameters of threshold voltage functions are adjusted in accordance with comparisons of the threshold voltages of some or all of the cells to two or more of $m \geq 2$ threshold voltage intervals within the threshold voltage window. Reference voltages for reading the cells are selected based on the values. Alternatively, the m threshold voltage intervals span the threshold voltage window, and respective threshold voltage states are assigned to the cells based on numbers of cells whose threshold voltages are in the intervals, without re-reading the cells.

20 Claims, 7 Drawing Sheets

ADAPTIVE DYNAMIC READING OF FLASH MEMORIES

This patent application claims the benefit of U.S. Provisional Patent Application No. 60/913,299, filed Apr. 23, 2007

FIELD AND BACKGROUND OF THE INVENTION

The present invention relates to multi-bit-per-cell flash memories and, more particularly, to a method of optimizing read reference voltages for a multi-bit-per-cell flash memory.

Originally, flash memories stored only one bit per cell. Flash memories that store two bits per cell now are available commercially, and flash memories that store more than two bits per cell are being developed. Conventionally, flash memories that store one bit per cell are called "Single Level Cell" (SLC) memories and flash memories that store more than one bit per cell are called "Multi Level Cell" (MLC) memories. This nomenclature is misleading because the cells of a SLC memory actually have two levels, for indicating whether the single bits stored therein are "1" bits or "0" bits. Therefore, these two kinds of flash memories are referred to herein as "Single Bit Cell" (SBC) memories and "Multi Bit Cell" (MBC) memories.

FIG. 1 illustrates how a bit pattern of three bits is stored in a MBC memory that is capable of storing three bits per cell.

The threshold voltage of a flash cell is in a range, called the "voltage window", from a minimum value $V_{min}$ to a maximum value $V_{max}$. For historical reasons, writing data to a flash cell is called "programming" the flash cell. (The terms "writing" and "programming" are used interchangeably herein.) This is done by applying voltage pulses to the cell, to inject electrons from the cell's silicon substrate through the cell's oxide layer into the cell's floating gate, until the threshold voltage of the cell is high enough within the voltage window to represent the desired bit pattern. In a three-bit-per-cell memory, the voltage window is divided into eight voltage bands: from $V_{min}$ to $V_1$, from $V_1$ to $V_2$, from $V_2$ to $V_3$, from $V_3$ to $V_4$, from $V_4$ to $V_5$, from $V_5$ to $V_6$, from $V_6$ to $V_7$ and from $V_7$ to $V_{max}$. A threshold voltage within one of the voltage bands represents a bit pattern as shown in FIG. 1: a threshold voltage between $V_{min}$ and $V_1$ represents the bit pattern "111", a threshold voltage between $V_1$ and $V_2$ represents the bit pattern "110", etc. In general, the voltage window of a m-bit-per-cell memory is divided into $2^m$ voltage bands.

To read a flash cell, the threshold voltage of the flash cell is compared to the reference voltages that define the voltage bands. In the case of some flash memories (hereinafter called "type 1" memories), reading a cell that stores a bit pattern of m bits requires m such comparisons. For example, when m=3, as illustrated in FIG. 1, the threshold voltage first is compared to $V_4$. Depending on the outcome of that comparison, the threshold voltage is compared to either $V_2$ or $V_6$. Depending on the outcome of the second comparison, the threshold voltage is compared to either $V_1$ or $V_3$ or $V_5$ or $V_7$. Note that this comparison does not assume prior knowledge of the threshold voltage: circuitry in the flash memory returns a signal indicating whether the threshold voltage is higher or lower than the reference voltage to which it is being compared.

In the case of some other flash memories (hereinafter called "type 2 memories"), the threshold values of all the cells that are read collectively are compared to all $2^m-1$ reference voltages between $V_{min}$ and $V_{max}$.

In a collection of flash cells, the threshold voltages of the cells are distributed statistically around the centers of their respective voltage bands. FIG. 1 shows the threshold voltages in the first voltage band distributed according to a distribution curve 10, the threshold voltages in the second voltage band distributed according to a distribution curve 12, the threshold voltages in the third voltage band distributed according to a distribution curve 14, the threshold voltages in the fourth voltage band distributed according to a distribution curve 16, the threshold voltages in the fifth band distributed according to a distribution curve 18, the threshold voltages in the sixth band distributed according to a distribution curve 20, the threshold voltages in the seventh band distributed according to a distribution curve 22 and the threshold voltages in the eighth band distributed according to a distribution curve 24. There are several reasons for the finite widths of these distributions:

1. The programming process is a stochastic one that relies on inherently stochastic processes such as quantum mechanical tunneling and hot injection.
2. The precision of the read/program circuitry is finite and is limited by random noise.
3. In some flash technologies, the threshold voltage of a cell being read is affected by the threshold voltages of neighboring cells.
4. Chip-to-chip variations and variations in the manufacturing process cause some cells to behave differently than other cells when read/programmed.

In addition, the threshold voltage distributions tend to change over time, as follows:

1. As a flash memory is programmed and erased, the voltage window tends to shrink and the voltage bands become biased. These phenomena limit the number of times a MBC flash memory can be erased and re-programmed.
2. The threshold voltage of a flash cell that is not programmed for a long time tends to drift downward. This phenomenon limits the time that data can be reliably retained in a flash memory.

The voltage bands of a flash cell should be designed to be wide enough to accommodate all these phenomena, but not too wide. A voltage band that is too narrow, relative to the associated threshold voltage distribution curve and relative to the drift of that curve over time, leads to an unacceptably high bit error rate. Making the voltage bands very wide relative to the associated threshold voltage distributions limits the number of bits in the bit patterns that can be stored in the flash cell. In practice, flash memories are designed to have one error per $10^{14}$-$10^{16}$ bits read. Some flash technologies are unable to achieve this error rate while storing the desired number of bits per cell. Some flash memories based on such technology use error correction circuits to compensate for their high intrinsic error rates. Some NAND flash manufacturers have instructed their customers to incorporate error-correcting code in their applications.

The problem of determining the optimal location of reference voltages for reading the contents of flash memory cells becomes especially acute when the number of programming levels increases. The reason for this is that when the number of levels is large, any inaccuracies in estimation of the information stored in the cells cause superfluous errors that can affect reliable performance of the memory.

The central problem in finding optimal reference voltages is that, as discussed above, the programmed threshold voltage levels are not constant, and may vary as a function of retention time, number of program/erase (P/E) cycles, as well as depend on particular production wafer, lot, chip, block, word and bit line. Therefore the behavior of a threshold voltage level programmed to a certain cell can be predicted only statistically.

As discussed above, the standard procedure for reading the contents of cells consists of comparison of the cell voltage with fixed reference voltages. The number of reference voltages is one less than the number of programming levels, as illustrated in FIG. 1, if "hard" information is used in processing (i.e. estimation of the stored bits without reference to the reliability of the estimation), otherwise the number of reference voltages is larger. See e.g. Guterman et al., U.S. Pat. No. 6,751,766 for an example of the use of more reference voltages than programming levels to estimate the reliability of read bits. U.S. Pat. No. 6,751,766 is incorporated by reference for all purposes as if fully set forth herein.

Several approaches are currently used for defining reference voltages. The simplest approach relies on placing the reference voltages at fixed voltages that are calculated based on theoretical and practical models following from measurements of flash devices. Such models allow minimization of the error probability in determining the correct programmed voltage level.

FIG. 2 presents an example of optimization for the choice of reference voltages (vertical dashed lines) between two voltage levels. The initial probability density functions (pdf's) for four neighboring levels are presented as solid lines while the corresponding pdf's after the maximum allowed number of P/E cycles followed by the maximum allowed data retention (DR) time are depicted as dotted line.

Clearly the optimal choice of the reference voltage corresponds to the optimal choice for the pdf's after P/E and DR. However, this choice might increase the error probability for the freshly programmed flash memory. Another drawback of the described scheme is that the models yielding pdf's are not accurate and actual behavior of flash voltages can essentially differ from the behavior predicted by a model.

If P/E is the sole cause of the changes of the pdf's, the reference voltages can be corrected based on a count of P/E cycles. If DR also contributes to the changes of the pdf's, a similar correction scheme often is not possible, among other reasons because time-stamping data stored in a flash memory often is inconvenient or impossible. The so called "dynamic reading" schemes assume several attempts of placing the reference voltages starting at locations corresponding to zero DR, and followed by reference voltages situated in the range between the locations corresponding to zero DR and the location for the maximum allowed DR. The suitability of a given set of reference voltages can be evaluated using standard error detection and correction schemes to detect when there are too many errors in the data, as read according to those reference voltages, to be corrected. FIG. 3 shows two such ranges, for reference voltage $V_r(i)$ and for reference voltage $V_r(i+1)$, with the range for reference voltage $V_r(i+1)$ labeled "Dynamic read range". As in FIG. 2, the initial pdfs are solid and the final pdfs are dotted. Such a scheme is taught by Lasser in US Patent Application Publication 2007/0091677, which patent application is incorporated by reference for all purposes as if fully set forth herein.

SUMMARY OF THE INVENTION

The prior art approaches possess a serious drawback in that they assume specific models of the flash voltages behavior. The present invention does not require such specific assumptions. The present invention is based on pure statistical processing of the data read from the flash memory. We assume that the size of logical and physical pages is large enough to justify validity and accuracy of the following approximations.

Assume that there are L possible voltage levels representing L possible states that can be stored in each cell. We are supposed to make a decision about the read reference voltages' placement based on the state of n cells. Our next assumption is that each of the L voltage levels appears approximately the same number of times in the initial programming. This can be achieved by using scrambling or balancing in the process of programming, as in Sharon et al., U.S. patent application Ser. No. 11/808,906.

An alternative is to require that one of the levels appear in the programmed data at least some prescribed minimum number of times. These assumptions are not essential, but they improve the accuracy and reduce the implementation complexity of the present invention, because more information on the cell voltage distribution is known (or is assumed as known) and fewer parameters need to be estimated.

The present invention assumes partitioning of the total threshold voltage window to m bins that determine the reading resolution. The number of read voltage levels m can exceed the number of programming levels L. In other words, the reading voltage resolution can be, and usually is, higher than the programming voltage resolution. From reading n cells the number of voltage values falling into each one of the bins (a histogram) can be determined.

Statistical processing of these data allows finding estimates for parameters of a superposition of L probability distributions corresponding to L programming voltage levels. This in turn allows computation of the L−1 reading reference voltages. These reference voltages can be used for reading of other cells that have been programmed at the same or about the same time as the n cells used for estimation.

Therefore, according to the present invention there is provided a method of programming and reading a plurality of flash memory cells, including the steps of: (a) programming each cell to a respective one of L≧2 threshold voltage states within a threshold voltage window; (b) adjusting a respective value of at least one parameter of at least one threshold voltage function in accordance with comparisons of respective threshold voltages of at least a portion of the cells to each of at least two of m≧2 threshold voltage intervals within the threshold voltage window; (c) based on the respective value of each at least one parameter of the at least one threshold voltage function, selecting at least one reference voltage; and (d) using the at least one reference voltage to read the cells.

Furthermore, according to the present invention there is provided a method of programming and reading a plurality of flash memory cells, including the steps of: (a) programming each cell to a respective one of L≧2 threshold voltage states within a threshold voltage window; (b) reading the cells relative to a set of initial reference voltages that define m≧2 threshold voltage intervals that span the threshold voltage window; (c) based on the reading, for at least a portion of the cells, determining how many of the cells of the portion have respective threshold voltages in each of at least two of the threshold voltage intervals, thereby obtaining, for each of the at least two threshold voltage intervals, a corresponding number of cells of the at least portion; (d) adjusting a respective value of at least one parameter of at least one threshold voltage function to fit the at least one threshold voltage function to the numbers, and (e) based on the respective value of each at least one parameter of the at least one threshold voltage function, and without reading the cells subsequent to the determining, assigning a respective one of the states to each cell of the plurality.

Furthermore, according to the present invention there is provided a memory device including: (a) a flash memory including: (i) a plurality of flash memory cells, and (ii) circuitry for: (A) programming each cell to a respective one of $L \geq 2$ threshold voltage states within a threshold voltage window, and (B) reading the cells by comparing a respective threshold voltage of each cell to at least one reference voltage; and (b) a controller for: (i) adjusting a respective value of at least one parameter of at least one threshold voltage function in accordance with comparisons of respective threshold voltages of at least a portion of the cells to each of at least two of $m \geq 2$ threshold voltage intervals within the threshold voltage window, and (ii) based on the respective value of each of the at least one parameter of the at least one threshold voltage function, selecting at least one reference voltage.

Furthermore, according to the present invention there is provided a system including: (a) a memory device including: (i) a plurality of flash memory cells, and (ii) circuitry for: (A) programming each cell to a respective one of $L \geq 2$ threshold voltage states within a threshold voltage window, and (B) reading the cells by comparing a respective threshold voltage of each cell to at least one reference voltage; and (b) a host, of the memory device, including: (i) a nonvolatile memory for storing a driver of the memory device, the driver including code for: (A) adjusting a respective value of at least one parameter of at least one threshold voltage function in accordance with comparisons of respective threshold voltages of at least a portion of the cells to each of at least two of $m \geq 2$ threshold voltage intervals within the threshold voltage window, and (B) based on the respective value of each of the at least one parameter of the at least one threshold voltage function, selecting at least one reference voltage, and (ii) a processor for executing the code of the driver.

Furthermore, according to the present invention there is provided a computer-readable storage medium having computer-readable code embedded thereon, the computer-readable code being driver code for a memory device that includes a plurality of flash memory cells and circuitry for: (a) programming each cell to a respective one of $L \geq 2$ threshold voltage states within a threshold voltage window; and (b) reading the cells by comparing a respective threshold voltage of each cell to at least one reference voltage; the computer-readable code including: (a) program code for adjusting a respective value of at least one parameter of at least one threshold voltage function in accordance with comparisons of respective threshold voltages of at least a portion of the cells to each of at least two of $m \geq 2$ threshold voltage intervals within the threshold voltage window; and (b) program code for selecting at least one of the at least one reference voltage, based on the respective value of each of the at least one parameter of the at least one threshold voltage function.

Furthermore, according to the present invention there is provided a memory is device including: (a) a flash memory including: (i) a plurality of flash memory cells, and (ii) circuitry for: (A) programming each cell to a respective one of $L \geq 2$ threshold voltage states within a threshold voltage window, and (B) reading the cells by comparing a respective threshold voltage of each cell to at least one reference voltage; and (b) a controller for: (i) instructing the circuitry to read the cells relative to at least one initial set of the reference voltages that together define $m \geq 2$ threshold voltage intervals that span the threshold voltage window, (ii) for at least a portion of the cells, based on the reading relative to the at least one initial set of the reference voltages, determining how many cells have respective threshold voltages in each of at least two of the threshold voltage intervals, thereby obtaining, for each of the at least two threshold voltage intervals, a corresponding number of cells of the at least portion, (iii) adjusting a respective value of at least one parameter of at least one threshold voltage function to fit the at least one threshold voltage function to the numbers, and (iv) based on the respective value of each at least one parameter of the at least one threshold voltage function, and without reading the cells subsequent to the determining, assigning a respective one of the states to each cell of the plurality.

Furthermore, according to the present invention there is provided a system including: (a) a memory device including: (i) a plurality of flash memory cells, and (ii) circuitry for: (A) programming each cell to a respective one of $L \geq 2$ threshold voltage states within a threshold voltage window, and (B) reading the cells by comparing a respective threshold voltage of each cell to at least one reference voltage; and (b) a host, of the memory device, including: (i) a nonvolatile memory for storing a driver of the memory device, the driver including code for: (A) instructing the circuitry to read the cells relative to at least one initial set of the reference voltages that together define $m \geq 2$ threshold voltage intervals that span the threshold voltage window, (B) for at least a portion of the cells, based on the reading relative to the at least one initial set of the reference voltages, determining how many cells have respective threshold voltages in each of at least two of the threshold voltage intervals, thereby obtaining, for each of the at least two threshold voltage intervals, a corresponding number of cells of the at least portion, (C) adjusting a respective value of at least one parameter of at least one threshold voltage function to fit the at least one threshold voltage function to the numbers, and (D) based on the respective value of each at least one parameter of the at least one threshold voltage function, and without reading the cells subsequent to the determining, assigning a respective one of the states to each cell of the plurality, and (ii) a processor for executing the code of the driver.

Furthermore, according to the present invention there is provided a computer-readable storage medium having computer-readable code embedded thereon, the computer-readable code being driver code for a memory device that includes a plurality of flash memory cells and circuitry for: (a) programming each cell to a respective one of $L \geq 2$ threshold voltage states within a threshold voltage window, and (b) reading the cells by comparing a respective threshold voltage of each cell to at least one reference voltage, the computer-readable code including: (a) program code for instructing the circuitry to read the cells relative to at least one initial set of the reference voltages that together define $m \geq 2$ threshold voltage intervals that span the threshold voltage window; (b) program code for, for at least a portion of the cells, based on the reading relative to the initial set of the reference voltages, determining how many cells have respective threshold voltages in each of at least two of the threshold voltage intervals, thereby obtaining, for each of the at least two threshold voltage intervals, a corresponding number of cells of the at least portion; (c) program code for adjusting a respective value of at least one parameter of at least one threshold voltage function to fit the at least one threshold voltage function to the numbers; and (d) program code for assigning a respective one of the states to each cell of the plurality, based on the respective value of each at least one parameter of the at least one threshold voltage function and without reading the cells subsequent to the determining.

The methods of the present invention are methods of programming and reading a plurality of flash memory cells. In the first step of both methods, each cell is programmed to a respective one of $L \geq 2$ threshold voltage states within a threshold voltage window. $L=2$ is the SBC case. $L>2$ is the MBC case. Although both methods may be used for the SBC case, hey are most useful for the MBC case.

The subsequent steps of both methods are intended to compensate for drift of the cells' threshold voltages subsequent to programming.

A basic embodiment of the first method includes three more steps. In the first additional step, a value of one or more parameters of one or more threshold voltage functions is/are adjusted in accordance with comparisons of the threshold voltages of at least some of the cells to each of at least two of $m \geq 2$ threshold voltage intervals within the threshold voltage window. A "threshold voltage function" is a function, one of whose arguments is threshold voltage. Typically, threshold voltage is the only argument of the function. The preferred threshold voltage function is a Gaussian function of threshold voltage, in which case the parameter(s) whose value(s) is/are adjusted could be either or both of the mean and the standard deviation of one or more Gaussian functions. In the second additional step, one or more reference voltages is/are selected, based on the adjusted value(s). In the third additional step, the selected reference voltage(s) is/are used to read the cells of the plurality.

A basic embodiment of the second method includes four mores steps. In the first additional step, the cells are read relative to a set of initial reference voltages that define $m \geq 2$ threshold voltage intervals that span the threshold voltage window. In the second additional step, based on that reading of the cells, it is determined how many of the cells of at least a portion of the cells (preferably of all the cells) have respective threshold voltages in each of at least two of the threshold voltage intervals. (Under appropriate assumptions, for example that all the threshold voltage drifts are identical, such a determination made for only two threshold voltage intervals may be valid for all the threshold voltage states.) In the third additional step, a value of one or more parameters of one or more threshold voltage functions (again, preferably Gaussian functions) is/are adjusted to fit the numbers of cells thus determined. For example, the parameter(s) whose value(s) is/are fitted could be either or both of the mean and the standard deviation of one or more Gaussian functions. In the fourth additional step, based on the adjusted value(s), and without again reading the cells subsequent to the determination of the numbers, a respective one of the threshold voltage states is assigned to each cell of the plurality.

In the first method, it is preferable that the m threshold voltage intervals span the threshold voltage window. Also in the first method, it is preferable that the determining be effected for all m threshold voltage intervals.

In both methods, preferably, $m \geq L$: in some preferred embodiments, $m=L$; in other preferred embodiments, $m>L$. In the latter case, most preferably, m is L multiplied by an integral power of 2.

In both methods, preferably, at least a predetermined number of the cells is programmed to each of the L threshold voltage states. Alternatively, in both methods, substantially equal numbers of the cells are programmed to each of the L threshold voltage states.

In both methods, preferably the adjusting is done iteratively, as in algorithm 3 below.

In the first method, preferably, L−1 reference voltages are selected.

In the first method, strictly speaking, it is not necessary to determining the number of cells whose threshold voltages are in each of the two or more of the m threshold voltage intervals in order to adjust the parameter(s) of the threshold voltage function(s) in accordance with the comparisons. Sample-by-sample parameter estimation algorithms are known in the art. See e.g. Manfred K. Warmuth and Yoram Singer, "A new parameter estimation method for Gaussian mixtures", in *Advances in Neural Information Processing Systems* 11, M. S. Kearns, S. A. Solla and D. A. Cohn, Eds., MIT Press (1999). Nevertheless, preferably, the adjusting of the parameter(s) is performed in conjunction with such determining. Specifically, it is determined how many cell threshold voltages are in each of the two or more of the m threshold voltage intervals, thereby obtaining, for each of the two or more of the m threshold voltage intervals, a corresponding number of cells. Then, the parameter value(s) is/are adjusted to fit the threshold voltage function(s) to those numbers. Most preferably, respective values of at least one parameter of each threshold voltage function of a superposition of a plurality of threshold voltage functions is adjusted to fit the superposition of threshold voltage functions to the numbers of cells. The reference voltage(s) is/are then selected based on the adjusted values.

In the second method, preferably, respective values of at least one parameter of each threshold voltage function of a superposition of a plurality of threshold voltage functions is adjusted to fit the superposition of threshold voltage functions to the determined numbers of cells. The states of the cells then are assigned based on the adjusted values.

In the first method, preferably, the selecting is constrained by requiring each selected reference voltage to be within a respective predefined reference voltage range.

The second method preferably also includes the further step of computing one or more new reference voltages, most preferably L−1 new reference voltages, based on the adjusted values. The assigning of the threshold voltage states to the cells of the plurality then is based on the new reference voltage(s). Most preferably, the computation of the new reference voltage(s) is constrained by requiring each new reference voltage to be within a respective predetermined range.

A memory device of the present invention includes a flash memory and a controller. The flash memory includes a plurality of flash memory cells and circuitry for programming each cell to a respective one of $L \geq 2$ threshold voltage states within a threshold voltage window and for reading the cells by comparing the cell's threshold voltage to at least one reference voltage. The controller manages the flash memory using one of the methods of the present invention. For example, preferably, the controller is operative to instruct the circuitry to program at least a predetermined number of the cells to each of the L threshold voltage states prior to the determining step of either method. As another example, preferably, the controller is operative to instruct the circuitry to program substantially equal numbers of the cells to each of the L threshold voltage states prior to the determining step of either method. In the determining step of the first method, and in the reading step of the second method, the controller may need to change the reference voltages temporarily to reference voltages that define the m threshold voltage intervals; and if m>L the controller normally needs to instruct the circuitry to read the cells more than once because the circuitry normally compares the cells' threshold voltages to at most L−1 reference voltages.

A system of the present invention includes a memory device and a host of the memory device. The memory device includes a plurality of flash memory cells and circuitry for programming each cell to a respective one of $L \geq 2$ threshold voltage states within a threshold voltage window and for reading the cells by comparing the cell's threshold voltage to at least one reference voltage. The host includes a nonvolatile memory for storing driver code for emulating the controller of a memory device of the present invention and a processor for executing the code. The scope of the present invention also includes a computer-readable storage medium having embedded thereon such driver code.

BRIEF DESCRIPTION OF THE DRAWINGS

The invention is herein described, by way of example only, with reference to the accompanying drawings, wherein.

DESCRIPTION OF THE PREFERRED EMBODIMENTS

The principles and operation of a flash memory according to the present invention may be better understood with reference to the drawings and the accompanying description.

In what follows we give examples of estimation procedures that can be used in the present invention.

Figure 4:
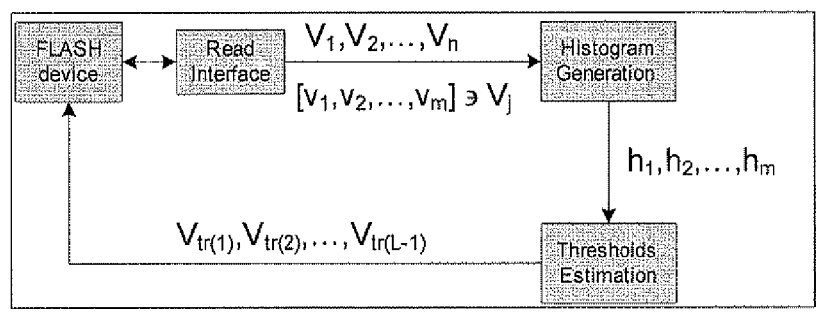
FIG. 4 is a conceptual block diagram of an apparatus of the present invention.

Referring again to the drawings, FIG. 4 is a conceptual block diagram of an apparatus of the present invention. The apparatus includes flash memory media ("FLASH device"), a read interface for reading n flash cells at a time, a computational block for generating the histogram, and a processing unit implementing computation of optimal read reference voltages from the histogram.

We are interested in determining the optimal read reference voltages based on the statistics of data read according to the current read reference voltages. We define the optimal read reference voltages as the reference values for which the expected Cell Error Rate (CER) from every voltage level to its adjacent voltage levels (i.e. the rate at which cells programmed to one voltage level are read as having been programmed to one of the two adjacent voltage levels) is equal.

In order to determine the optimal read reference voltages (with respect to the "equal CER" criterion) we need to assume a model of the Cell Voltage-levels Distribution (CVD), and estimate the parameters of the model based on current read reference voltages.

We denote the probability of reading a cell at threshold voltage level V given that the model parameters are $\theta$ as $P(V|\theta)$. Note that V is quantized to m levels, i.e. $V \in \{\bar{v}_1, \bar{v}_2, \ldots, \bar{v}_m\}$. Usually, m is L times a power of two. For the case of L=4 possible cell states (2 bits per cell) the reading resolution can be m=4, 8, 16, 32, 64 ... etc. For the case of L=16 possible cell states (4 bits per cell) the reading resolution can be m=16, 32, 64, 128, 256 ....

We need to compute an estimate of $\theta$, denoted as $\hat{\theta}$, based on the set of read threshold voltage levels $\underline{V}[V_1 \bar{V}_2 \bar{\ldots} V_n]$, where $V_i$ is the threshold voltage level read from the i'th cell and n is the number of read cells. We assume that the read voltage levels are statistically independent and identically distributed (i.i.d.) according to $P(V|\theta)$. In other words, $$P(\underline{V}|\theta) = \prod_{i=1}^{n} P(V_i|\theta) \quad (1.1)$$

This assumption allows us to "summarize" the information in $\underline{V}$ using the histogram $\underline{h}=[h_1\ h_2\ \ldots\ h_m]$, where $h_j$ is the number of cells read at voltage level $v_j$. Under the assumption that the read voltage levels are i.i.d., the histogram $\underline{h}$ provides sufficient statistics for estimation of the CVD model parameters $\theta$ (i.e. optimal estimation of $\theta$ based on $\underline{V}$ and $\underline{h}$ provides the same result: $\hat{\theta}(\underline{V})=\hat{\theta}(\underline{h})$). The advantage of using the histogram $\underline{h}$ over the raw data in the read voltage levels sequence $\underline{V}$ is that the dimensionality of the input for the estimation algorithm is reduced from n to m and m<<n.

Two of the possible approaches in estimation theory for solving the problem at hand are:

Maximum Likelihood (ML) estimation: find the most likely model parameters given the observations:

$$\hat{\theta}(\underline{h}) = \arg\max_{\theta} P(\underline{h}|\theta) \quad (1.2)$$

Bayesian estimation: here estimation is based on the joint probability distribution of $\theta$ and $\underline{h}$, given by:

$$P(\underline{h},\theta)=P(\underline{h}|\theta) \cdot P(\theta)=P(\theta|\underline{h}) \cdot P(\underline{h}) \quad (1.3)$$

In other words, we also consider a-priori knowledge about the model parameters. The estimation can be done by optimizing one of several cost functions [such as Minimal Mean Square Error (MMSE), absolute error, Maximum A-Posteriori (MAP), . . . , etc].

Bayesian estimation according to the MAP criterion is given by:

$$\begin{aligned}\hat{\theta}(\underline{h}) &= \arg\max_{\theta} P(\underline{h}, \theta) \\ &= \arg\max_{\theta} P(\underline{h}|\theta) \cdot P(\theta) \\ &= \ldots \\ &= \arg\max_{\theta} P(\theta|\underline{h}) \cdot P(\underline{h}) \\ &= \arg\max_{\theta} P(\theta|\underline{h})\end{aligned} \quad (1.4)$$

The last equality is a result of the fact that $P(\underline{h})$ is independent of $\theta$.

Bayesian estimation according to the MMSE criterion is given by:

$$\hat{\theta}(\underline{h}) = \underline{E}(\theta|\underline{h}) = \sum_{\theta} \theta \cdot P(\theta|\underline{h}) \quad (1.5)$$

Note that when Gaussian distributions are assumed all common Bayesian estimation criteria reduce to the same solution. In general, Bayesian estimation algorithms often are better than ML estimation algorithms (for example, the achievable MMSE often is smaller), because a-priori knowledge about the model parameters $\theta$ is taken into account. However, for this reason Bayesian estimation methods are also less robust than ML estimation algorithms.

If we would like to assume as little as possible on the CVD (due to limited knowledge about the physical phenomena occurring in the Flash memory) it is better to use methods that are based on ML estimation. As shown in the example below, even these methods provide very good results.

Note that the estimation can also be improved if we know the actual data that were programmed into the Flash memory. Such information can be obtained either by using reference cells or by taking into account available ECC decoding results. Such information not only improves the estimation but can also considerably simplify the estimation algorithms.

The estimated CVD parameters (e.g., in the case of Gaussian distributions, the expectation $\mu_s$ and the standard deviation $\sigma_s$ of the voltage distribution of each state s) can be used in order to directly compute bit estimates for the bits of each cell given the cell's read voltage, with or without re-reading the cell with new reading threshold voltages. For example, if a "soft" ECC decoder is used, the decoder can be initialized with "soft" bit estimations, such as log likelihood ratios (LLRs) that can be computed based on the read cell voltage and the estimated CVD parameters. In this case, for each bit i stored in a cell, the LLR for the bit, $L_i$, can be computed as follows:

$$L_i = \log \left\{ \frac{\sum_{s \in s_i^0} \frac{1}{\sqrt{2\pi}\sigma_s} \exp\left(-\frac{(v-\mu_s)^2}{2\sigma_s^2}\right)}{\sum_{s \in s_i^1} \frac{1}{\sqrt{2\pi}\sigma_s} \exp\left(-\frac{(v-\mu_s)^2}{2\sigma_s^2}\right)} \right\}$$

Figure 1:
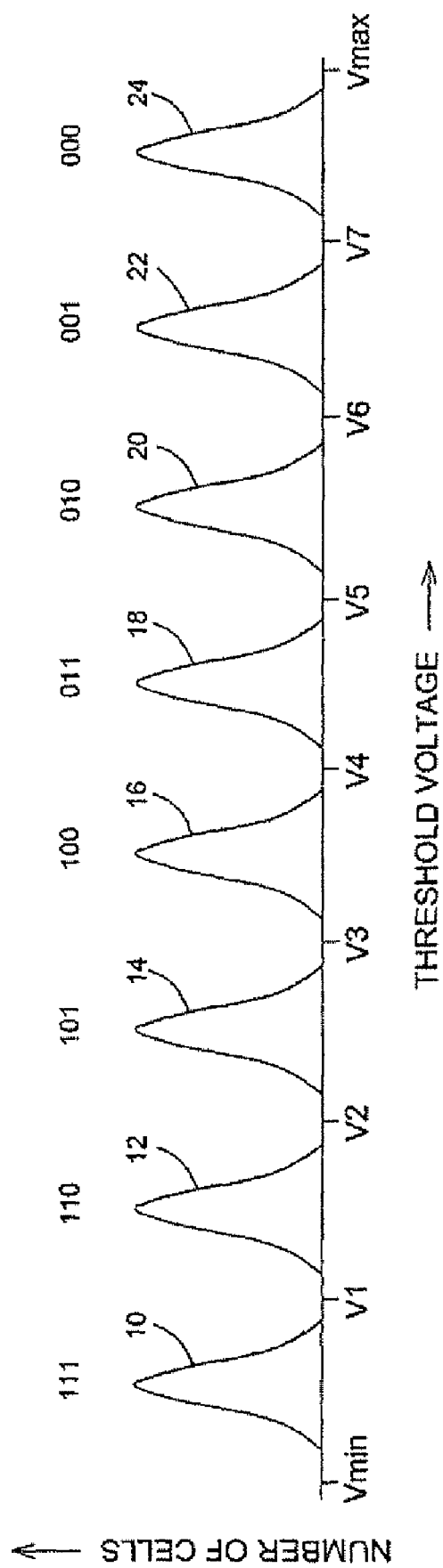
FIG. 1 illustrates how a bit pattern of three bits is stored in a MBC memory that is capable of storing three bits per cell.

The sum over $s_i^0$ is a sum over all the states s for which bit i is a "zero" bit. The sum over $s_i^1$ is a sum over the remaining states, i.e., all the states for which bit i is a "one" bit. For example, in a three-bit-per-cell memory, with states mapped to threshold voltages as shown in FIG. 1, for the leftmost bit, the sum in the numerator would be over the four rightmost states and the sum in the denominator would be over the four leftmost states; for the middle bit, the sum in the numerator would be over the third and fourth states from the left and the first and second states from the right and the sum in the denominator would be over the first and second states from the left and the third and fourth states from the right; and for the rightmost bit, the sum in the numerator would be over the second and fourth states from the left and the first and third states from the right and the sum in the denominator would be over the first and third states from the left and the second and fourth states from the right.

CVD Model

In the example below we model the CVD of an L-level cell as a superposition of L Gaussian pdf's. This is not an essential assumption. However, we use it for two reasons:

1. Empirical CVD measurements in Flash memory devices show that the CVD of the cell resembles as a mixture of Gaussian pdf's, at least when considering the centers of mass of the CVD excluding its low probability tails.

2. The Gaussian superposition model assumption simplifies the estimation algorithms considerably.

Under the Gaussian assumption, the function $P(V|\underline{\theta})$ is modeled as:

$$P(V = v \mid \underline{\theta}) = \frac{\sum_{i=1}^{L} \lambda_i \frac{1}{\sqrt{2\pi\sigma_i^2}} e^{-\frac{(v-\mu_i)^2}{2\sigma_i^2}}}{\sum_{i=1}^{L} \lambda_i \int_{-\infty}^{\infty} \frac{1}{\sqrt{2\pi\sigma_i^2}} e^{-\frac{(v-\mu_i)^2}{2\sigma_i^2}} \cdot \partial v} \quad (2.1)$$

In a discrete system the threshold voltage levels are quantized, therefore assuming 'm' such threshold voltage levels:

$$P(V = v_j \mid \underline{\theta}) = \frac{\sum_{i=1}^{L} \lambda_i \cdot A(v_j, \mu_i, \sigma_i)}{\sum_{z=1}^{m} \sum_{i=1}^{L} \lambda_i \cdot A(v_z, \mu_i, \sigma_i)} \quad (2.2)$$

$$\forall j \in \{1, \ldots, m\}$$

where $$A(v_j, \mu_i, \sigma_i) = \begin{cases} Q\left(\frac{v_j - \mu_i}{\sigma_i}\right) - Q\left(\frac{v_{j+1} - \mu_i}{\sigma_i}\right) & \text{for } v_j, v_{j+1} > \mu_i \\ Q\left(\frac{\mu_i - v_{j+1}}{\sigma_i}\right) - Q\left(\frac{\mu_i - v_j}{\sigma_i}\right) & \text{for } v_j, v_{j+1} < \mu_i \\ 1 - Q\left(\frac{\mu_i - v_j}{\sigma_i}\right) - Q\left(\frac{v_{j+1} - \mu_i}{\sigma_i}\right) & \text{for } v_j < \mu_i < v_{j+1} \end{cases} \quad (2.3)$$

and Q(x) is the Gaussian error function:

$$Q(x) = \frac{1}{\sqrt{2\pi}} \int_x^{\infty} e^{-\frac{x^2}{2}} \quad (2.4)$$

For example, for $v_j > \mu_i$ $A(v_j, \mu_i, \sigma_i)$ is:

$$A(v_j, \mu_i, \sigma_i) = \frac{1}{\sqrt{2\pi\sigma_i^2}} \cdot \int_{v_j}^{v_{j+1}} e^{-\frac{(v-\mu_i)^2}{2\sigma_i^2}} \partial v \quad (2.5)$$

Note that in (2.3) without loss of generality $v_{j+1} > v_j$. Also we regard $v_j$ to be the is voltage on the left (smaller) side of bin j. In other words, the parameter vector is $\theta = [\lambda_1 \ldots \lambda_L \mu_1 \ldots \mu_L \sigma_1 \ldots \sigma_L]$, where $\lambda_i$ is the probability for programming state i, $\mu_i$ is the expectation of the cell voltage level given that state i is programmed and $\sigma_i$ is the variance of the cell voltage level given that state i is programmed.

If the user data are scrambled prior to programming, we can further assume that programming each cell state is equally likely hence $\forall i\, \lambda_i = 1/L$. In this case we need to estimate fewer parameters (i.e. $\theta = [\mu_1 \ldots \mu_L \sigma_1 \ldots \sigma_L]$), increasing the estimation accuracy and reducing the estimation complexity.

The following are three estimation algorithms for estimating optimal read reference voltages. The first algorithm assumes complete knowledge of the programmed data. The two other algorithms do not utilize information on the programmed data.

Algorithm 1: Expectation and Variance Estimation

We assume that we know the state that each cell was programmed to, either by using reference cells or by taking into account available ECC decoding results. The input to the algorithm is 'L' histograms $h_1, h_2, \ldots, \underline{h}_L$, where $\underline{h}_i=[h_{i1}, h_{i2}, \ldots, h_{im}]$ is the histogram of all the cells that were programmed to state i. In this case, the estimation algorithm is very simple:

$$\mu_i = \frac{\sum_{j=1}^{m} h_{ij} v_j}{\sum_{j=1}^{m} h_{ij}}, \quad (3.1)$$

$$\sigma_i^2 = \frac{\sum_{j=1}^{m} h_{ij}(v_j - \mu_i)^2}{\sum_{j=1}^{m} h_{ij}}$$

$$\forall i \in \{1, \ldots, L\}$$

Here the value of $v_j$ is taken as the middle point of each histogram bin $h_j$ unlike the case in equation (2.2) were $v_j$ was measured as the threshold voltage corresponding to the left side of the bin.

Once the Gaussian superposition parameters have been estimated we can compute the optimal read voltage thresholds, providing equal CER for every programmed state as follows:

$$\forall i \in \{1, \ldots, L-1\} \quad (3.2)$$

$$Q\left(\frac{V_{R_i} - \mu_i}{\sigma_i}\right) = Q\left(\frac{\mu_{i+1} - V_{R_i}}{\sigma_{i+1}}\right) \Rightarrow V_{R_i} = \frac{\mu_{i+1}\sigma_i + \mu_i \sigma_{i+1}}{\sigma_i + \sigma_{i+1}}$$

where $V_{R_i}$ is the read voltage threshold between state i and state i+1, and Q(x) is as in (2.4). Because the thresholds are discrete, after the computation of $V_{R_i}$, $V_R$ is rounded to the nearest $v_q$ possible under the flash resolution limits, i.e.

$$\hat{V}_{R_i} = \underset{v_q, q \in \{1,2,\ldots,s\}}{\operatorname{argmin}} \{|V_{R_i} - v_q|\} \quad (3.3)$$

Note that $s \geq m$.

Algorithm 2: Estimation of CVD Minima

The second algorithm we consider is an estimation algorithm that does not assume any knowledge of the programmed data, nor, beyond assuming that L is known and that m is sufficiently large to distinguish among the states, does it assume an explicit model for the CVD.

Denoting the number of programmed voltage states in each cell as L, the algorithm directly estimates L−1 read voltage thresholds as the L−1 minima points in the CVD, that are estimated as minima points in the histogram h.

It can be shown that for a Gaussian superposition model, the optimal read reference voltage between two adjacent states, providing equal CER from one state to another, is located at the threshold voltage level for which the two states' joint pdf attains its minimum, if their corresponding Gaussians have equal likelihoods and equal variances.

Denoting as before the number of bins in the histogram as "m", then evidently in order for this algorithm to work properly it is preferred that m>L.

Figure 2:
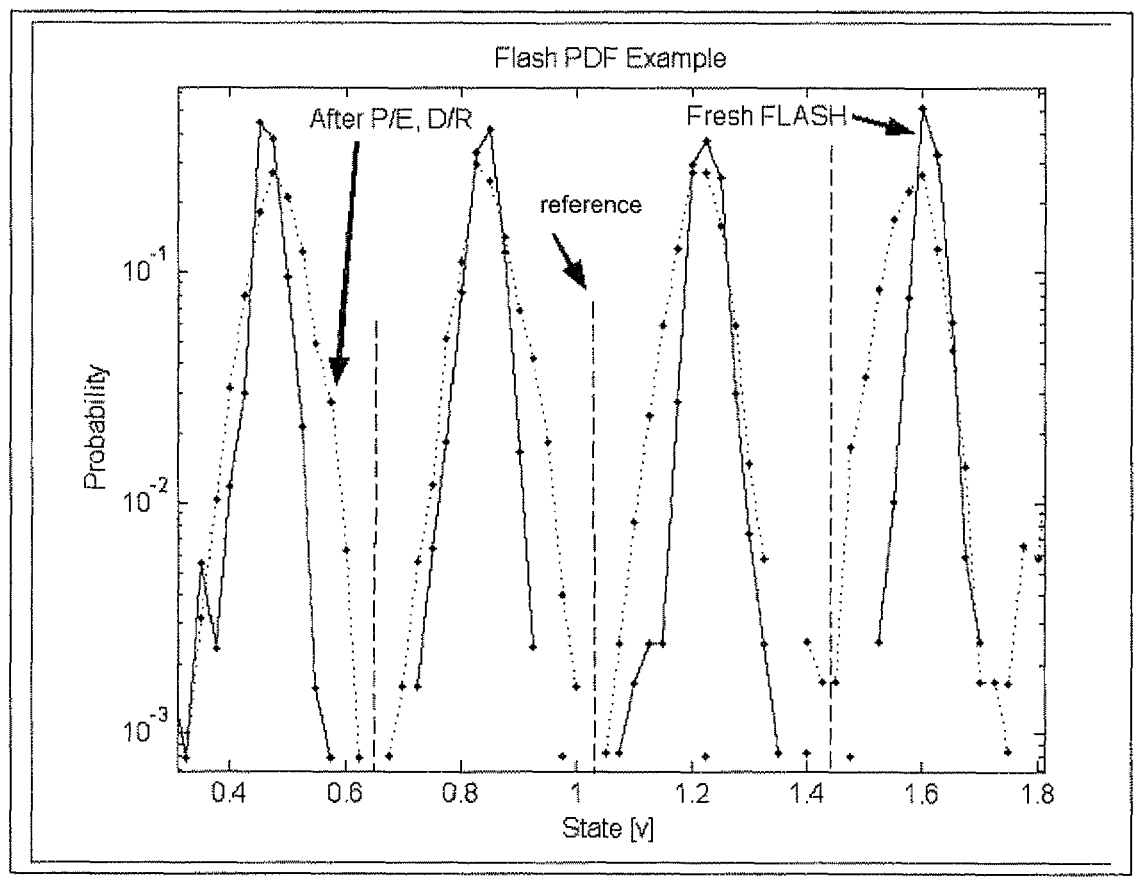
FIG. 2 illustrates optimization of reference voltages.
Figure 3:
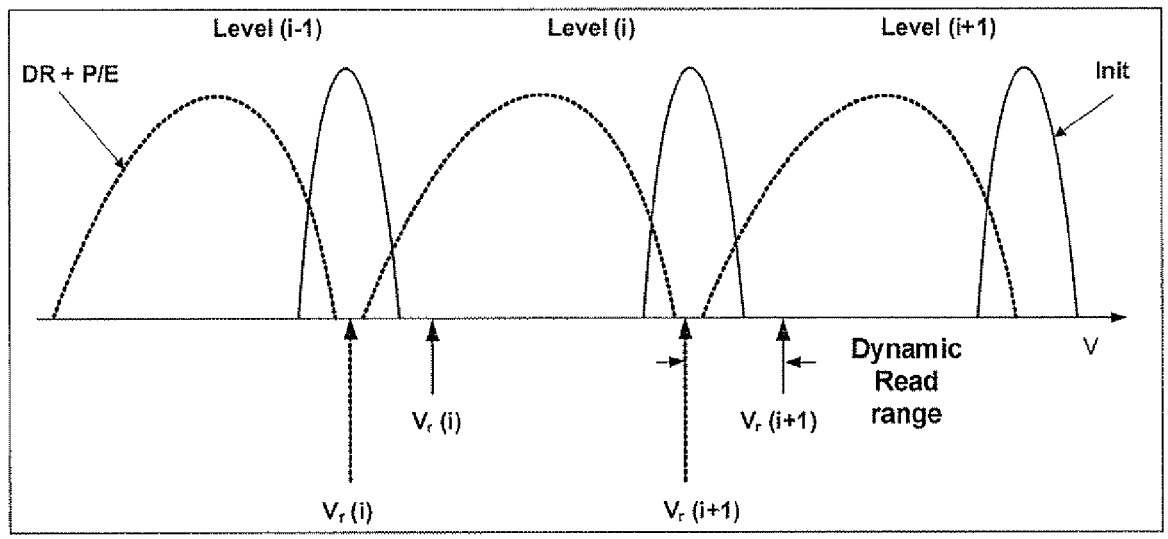
FIG. 3 illustrates dynamic reading of a flash memory.

In order to increase the robustness of the algorithm in the case of "noisy" behavior of the histogram near the minima points of the CVD due to insufficient statistics, as shown in FIG. 2 above, we use the following method:

1) Find L maxima points in h that are at least k histogram bins apart, with k being a programmable integer. In one preferred embodiment, k is chosen so that the maxima points are at least 0.5 W/L apart, where W is the total width of the voltage window. For example, if W is 4 volts, L is 8 and m is 32, then find the maximal $h_i$ in h, remove $h_{i-2}, h_{i-1}, h_i, h_{i+1}$ and $h_{i+2}$ from the list, find the new maximal points in h, and so on until L maxima are found. In this example, adjacent maxima are guaranteed to be at least 250 mv apart.

2) Find a minimal point of h between each two adjacent maximal points that are found in step 1. Set the threshold voltage levels corresponding to the L−1 minima points that are found as the read reference voltages.

There are many other heuristics that can be used, such as finding the local minimum of h nearest the threshold voltage halfway between two adjacent maximal points. The read reference voltages need not be exactly at the corresponding local minima. Requiring each read reference voltage to be within about 0.5 W/L of the corresponding local minimum guarantees, except in pathological cases, a 1:1 correspondence between read reference voltages and programmed voltage states. It is recommended to constrain the read reference voltages even more: each read reference voltage should be within about 0.25 W/L of the corresponding local minimum.

Algorithm 3: Expectation Maximization Parameter Estimation

The third estimation algorithm is also the most complex algorithm. The third estimation algorithm is based on the Expectation Maximization algorithm (EM) of A. P. Dempster, N. M. Laird and D. B. Rubin, "Maximum likelihood from incomplete data via the EM algorithm", *Journal of the Royal Statistical Society*, vol. 39 no. 1 pp. 1-38 (1977). The EM algorithm is an iterative estimation algorithm for finding a local ML estimator. The EM algorithm converges to a local maximum of the likelihood function $P(h|\theta)$ near an initial guess $\theta_0$ and not necessarily to the global maximum that provides the optimal ML estimation.

The following is a modification of Dempster et al. made suitable according to the requirements of a flash memory cell. The modifications with respect to Dempster et al. are:

- We use the fact that the user data are scrambled so that each programming state includes approximately the same number of samples. In other words, we do not estimate the likelihood of each Gaussian function in the mixture; we assume that all the likelihoods are equal.
- The input data are provided as the histogram and not as raw data as in Dempster et al.
- We do not need to estimate the number of programming states. That number is known to the algorithm, i.e. L is known.

The convergence region and convergence rate of the algorithm depend on its initialization and updating procedures. Employing the same notations as above for L, m, h, v, $V_R$, $\mu$ and σi a simple non-optimized version of the algorithm is as follows:

Input:

$$\underline{h}=[h_1, \ldots, h_m], \underline{v}=[v_1, \ldots, v_m], L \quad (4.1)$$

Initialization:
  Let $V_{R_0}=-\infty, V_{R_L}=\infty$.
  Use algorithm 2 to find an initial guess of the read voltage thresholds, $V_{R_i}$ for i=1, \ldots, L−1.
  Compute an initial guess for the Gaussians' expectations and variances as follows:

$$\forall\, i \in \{1, \ldots, L\} \tag{4.2}$$

$$J(i) \triangleq \{j \in \{1, \ldots, m\}: V_{R_{i-1}} \leq v_j \leq V_{R_i}\}$$

$$\mu_i = \frac{\sum_{j \in J(i)} h_j \cdot v_j}{\sum_{j \in J(i)} h_j},$$

$$\sigma_i^2 = \frac{\sum_{j \in J(i)} h_j \cdot (v_j - \mu_i)^2}{\sum_{j \in J(i)} h_j}$$

where $v_j$ is the middle point of bin $h_j$.

Iteration $\forall j \in \{1, \ldots, m\}$ compute:

$$P(V = v_j \mid i) = \frac{A(v_j, \mu_i, \sigma_i)}{\sum_{j'=1}^{n} A(v_{j'}, \mu_i, \sigma_i)}, \tag{4.3}$$

$$P(V = v_j) = \sum_{i=1}^{L} \frac{1}{L} P(V = v_j \mid i)$$

where $A(v_j, \mu_i, \sigma_i)$ is defined as in (2.3) while $v_j$ denote the voltage at the left side of bin $h_j$.

$\forall i \in \{1, \ldots, L\}$ Compute:

$$\mu_i = \frac{\sum_{j=1}^{m} h_j \frac{P(V = v_j \mid i)}{P(V = v_j)} v_j}{\sum_{j=1}^{m} h_j}, \tag{4.4}$$

$$\sigma_i^2 = \frac{\sum_{j=1}^{m} h_j \frac{P(V = v_j \mid i)}{P(V = v_j)} (v_j - \mu_i)^2}{\sum_{j=1}^{m} h_j}$$

where $v_j$ again denotes the voltage at the left side of bin $h_j$.

Termination

Compute the reference voltage levels and round their values to the nearest discrete level.

$$\forall\, i \in \{1, \ldots, L-1\}\, V_{R_i} = \frac{\mu_{i+1} \sigma_i + \mu_i \sigma_{i+1}}{\sigma_i + \sigma_{i+1}} \tag{4.5}$$

$$\hat{V}_{R_i} = \text{round}\left\{\frac{V_{R_i}}{\Delta v}\right\} \cdot \Delta v, \quad \Delta v = \frac{W}{s}$$

where 'W' is the total width of the voltage window, as in the second algorithm. W is divided into s quantized voltage levels, each of a size $\Delta v$.

Once the updated read reference threshold voltages are computed, there are two ways to use these read reference threshold voltages in order to determine the data originally stored in the memory cells.

A. We read the memory cells again, this time using the updated read reference threshold voltages just computed.

B. No additional reading of the memory cells is done. Instead the results of the original reading of the cells, as used to construct the histogram, are preserved and are now used, together with the preferred read reference threshold voltages, for recovering the data as stored in the cells. This method assumes that m>L. This method is especially useful when the resolution of reading the cells for generating the histogram is much finer than the resolution of regular reading the cells for determining the data, i.e. m>>L.

In other words, the number of cell states represented in the histogram preferably is much larger than the number of cell states used for representing different bit patterns in each cell. In such a case we may translate the high resolution state of each cell into its corresponding programmed state, letting the border lines between programmed states be determined by the newly computed updated read reference threshold voltages. The accuracy of this operation improves as the ratio m/L increases.

In addition we can re-compute the reliability of each bit pattern in each cell according to the newly computed preferred reference voltages, thus allowing a following ECC decoding to be provided with improved input thus improving the performance of the ECC decoding.

An additional enhancement to the computation of the new read reference threshold voltages is to limit the value of each read reference threshold voltage to a predetermined range of voltages. This serves as a "safety valve", avoiding divergence of the computation or its convergence to incorrect solutions. This enhancement is especially useful for algorithm 3 that is iterative in nature. The predetermined ranges are set according to the worst-case change one can expect for each of the states of the cells.

Example

We performed simulations to evaluate the effectiveness of algorithm 2 and 3 using L=16 and several values for m.

The simulations were performed using the following steps:

We started with a multi-Gaussian CVD corresponding to initial (default) read voltage thresholds.

With $\Delta\omega=W/64$, for each of the Gaussians in the CVD we randomly chose a shift SH based on a normal distribution $N(\mu_{SH}=-1.07\Delta\omega, \sigma_{SH}=0.53\Delta\omega)$ and a widening factor WD based on a normal distribution $N(\mu_{WD}=0, \sigma_{WD}=0.21\Delta\omega)$ and changed the Gaussians parameters accordingly. In other words, the i-th Gaussian in the updated CVD is a Gaussian that initially had a distribution $N(\mu_i, \sigma_i)$, where $\sigma_i=\Delta\omega$ and $\mu_i=iW/16$, and after the change had a distribution $N((\mu_f=\mu_i+\mu_{SH}, \sigma_f=\sqrt{\sigma_i^2+\sigma_{WD}^2+\sigma_{SH}^2})$.

We randomly generate a read page according to the updated CVD.

We measure the CER according to the default read reference threshold voltages, denoted as $CER_{default}$.

We measure the CER according to the optimal read reference threshold voltages for the updated CVD, denoted as $CER_{opt}$.

We generate a histogram based on the read page and use it for computing new read reference threshold voltages using algorithm 2 and algorithm 3.

We measure the CER according to the new read reference threshold voltages of algorithm 2 and 3, denoted as $CER_{alg2}$ and $CER_{alg3}$, respectively.

Figure 5:
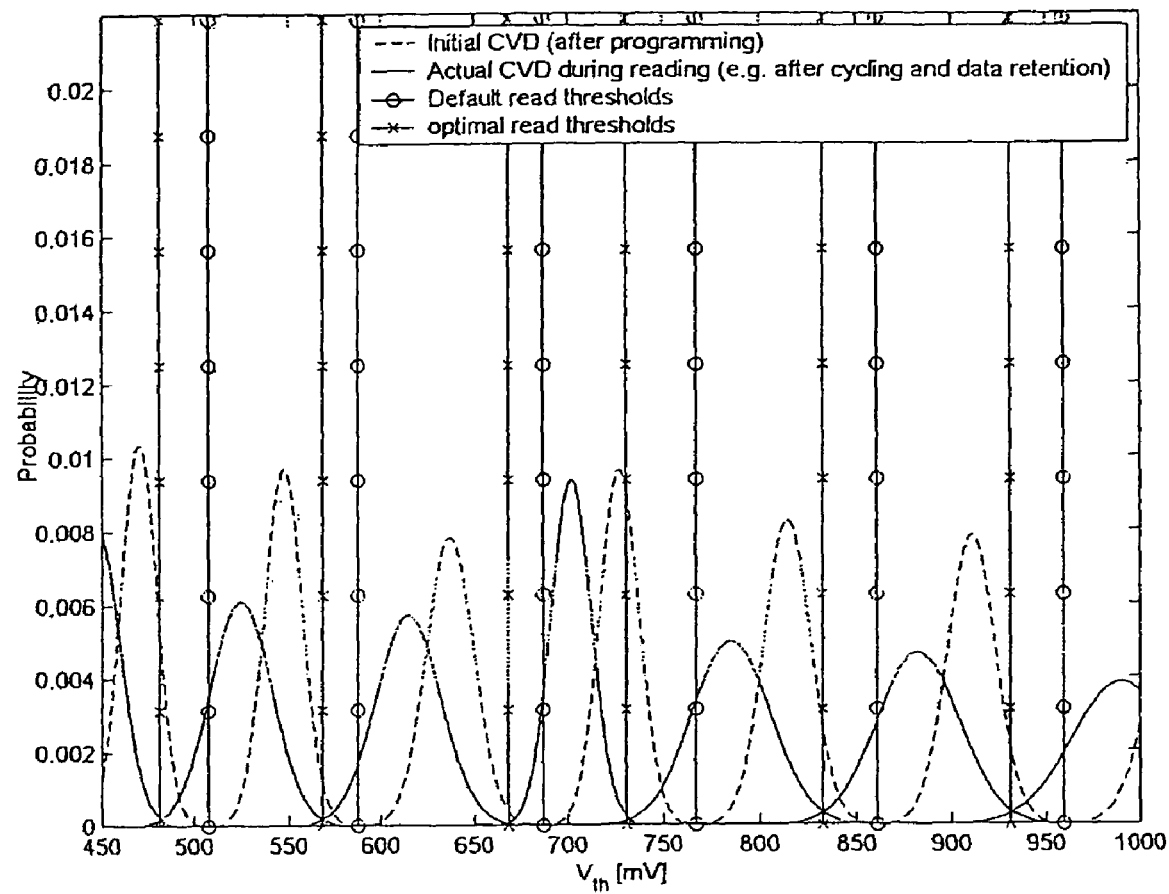
FIGS. 5 and 6 illustrate a simulation of algorithms 2 and 3.
Figure 6:
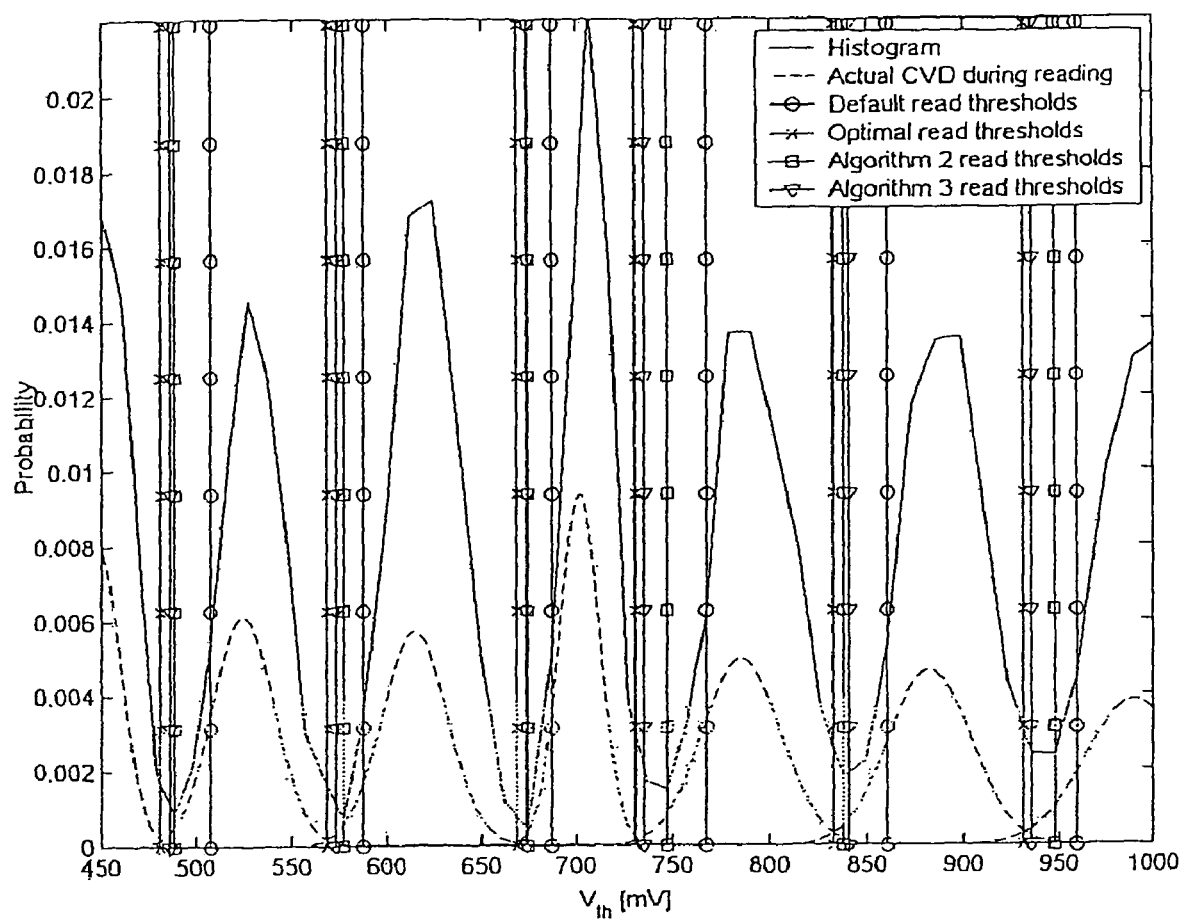

FIGS. 5 and 6 show some of the results of the simulation. In FIG. 5, the original CVD is the dashed curve and the shifted and widened CVD is the solid curve. In FIG. 6, the shifted and widened CVD is the dashed curve and the histogram for m=64 is the solid curve. In both FIGS. 5 and 6, the default read reference threshold voltages, that are appropriate to the original CVD, are shown by vertical lines with circles, and the optimal read reference threshold voltages, that are appropriate to the shifted and widened CVD, are shown by vertical lines with x's. In FIG. 6, the read reference threshold voltages computed according to algorithm 2 are shown by vertical lines with squares, and the read reference threshold voltages computed according to algorithm 3 are shown by vertical lines with triangles.

The expected CER results from 100 experiments for each $m \geq 4L$ option are given in the following table:

|  | m = 64 | m = 128 | m = 256 |
|---|---|---|---|
| $CER_{default}$ | 14.2% | 15.7% | 16% |
| $CER_{opt}$ | 2.2% | 2.8% | 2.8% |
| $CER_{alg2}$ | 6.1% | 4.3% | 3.9% |
| $CER_{alg3}$ | 4.2% | 3.3% | 3.0% |

It is not strictly necessary to estimate the drifts of all L voltage levels using the methodology described above. Under appropriate assumptions, for example that the drift $V_d$ is a linear function of voltage state $V_s$, i.e., $V_d = a \times V_s + b$ where a and b are constants, a and b are estimated from the drifts $\{v_d^{(i)}, 1 \leq i \leq n, n < L\}$ of only a portion of the voltage states $\{v_s^{(i)}, 1 \leq i \leq n, n < L\}$ as estimated above, by least squares:

$$\hat{a} = \frac{n \sum_{i=1}^{n} v_d^{(i)} v_s^{(i)} - \left(\sum_{i=1}^{n} v_d^{(i)}\right)\left(\sum_{i=1}^{n} v_s^{(i)}\right)}{n \sum_{i=1}^{n} (v_s^{(i)})^2 - \left(\sum_{i=1}^{n} v_s^{(i)}\right)^2} \quad (5.1)$$

$$\hat{b} = \frac{1}{n} \sum_{i=1}^{n} (v_d^{(i)} - \hat{a} v_s^{(i)})$$

For example, if L=16, $v_d^{(1)}$, $v_d^{(2)}$ and $v_d^{(i)}$ are estimated using the methodology described above, â and b̂ are estimated using equations (5.1), and the linear relationship $V_d = a \times V_s + b$ is used to estimate $v_d^{(4)}$ though $v_d^{(16)}$ from $v_s^{(4)}$ through $v_s^{(16)}$ by standard linear recursion.

Figure 7:
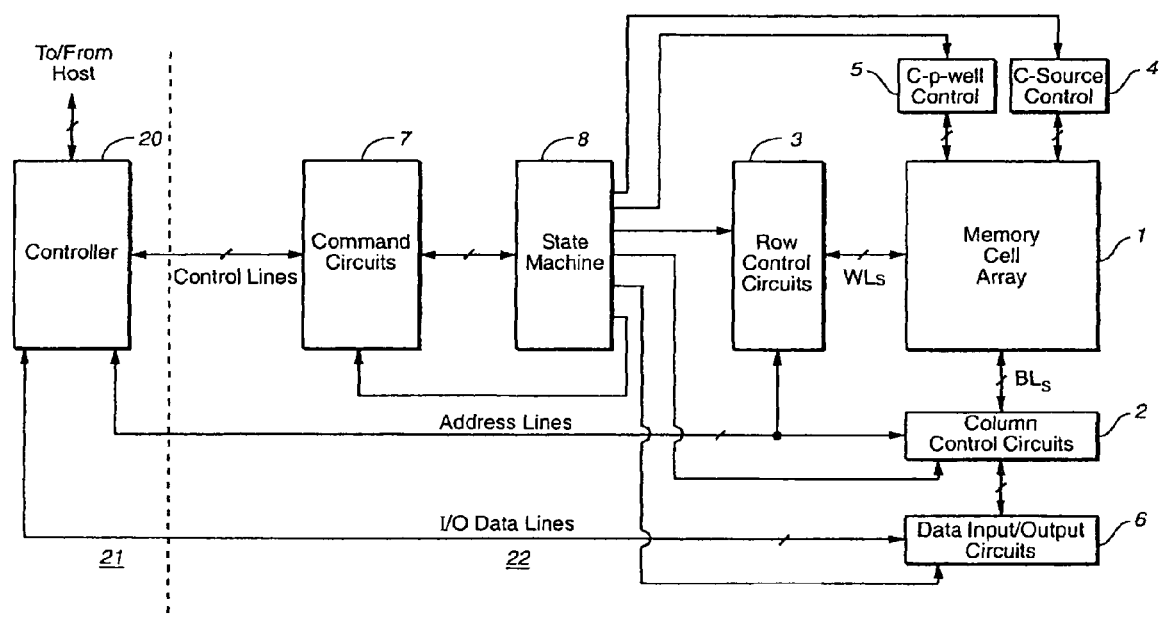
FIG. 7 is a high-level block diagram of a flash memory device of the present invention.

FIG. 7, which is taken from FIG. 1 of Chen et al., U.S. Pat. No. 6,522,580, is a high-level block diagram of a flash memory device of the present invention. A memory cell array 1 including a plurality of memory cells M arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a program operation, and for controlling voltage levels of the bit lines (BL) to promote the programming or to inhibit the programming. Row control circuit 3 is connected to word lines (WL) to select one of the word lines (WL), to apply read voltages, to apply programming voltages combined with the bit line voltage levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage. Typically, in a NAND flash device, the cells controlled by one word line correspond to one or two pages of the device.

The data stored in the memory cells (M) are read out by column control circuit 2 by comparing the threshold voltages of the memory cells of the word line being read to one or more reference voltages, and are output to external I/O lines via an I/O line and a data input/output buffer 6. Program data to be stored in the memory cells are input to data input/output buffer 6 via the external I/O lines, and are transferred to the column control circuit 2. The external I/O lines are connected to a controller 20.

Command data for controlling the flash memory device are input to a command interface connected to external control lines that are connected with controller 20. The command data informs the flash memory of what operation is requested. The input command is transferred to a state machine 8 that controls column control circuit 2, row control circuit 3, c-source control circuit 4, c-p-well control circuit 5 and data input/output buffer 6. State machine 8 can output a status data of the flash memory such as READY/BUSY or PASS/FAIL.

Controller 20 is connected or connectable with a host system such as a personal computer, a digital camera, a personal digital assistant. It is the host that initiates commands, such as to store or read data to or from memory array 1, and provides or receives such data, respectively. Controller 20 converts such commands into command signals that can be interpreted and executed by command circuits 7. Controller 20 also typically contains buffer memory for the user data being programmed to or read from memory array 1. A typical memory system includes one integrated circuit chip 21 that includes controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

Controller 20 also refines the reading of the stored data by the circuits on circuit chip 21 using one or more of the methods of the present invention: selecting one or more of the reference voltages in accordance with a histogram of threshold voltage bins and/or using the histogram to correct the state assignments of the read cells without re-reading the cells.

Figure 8:
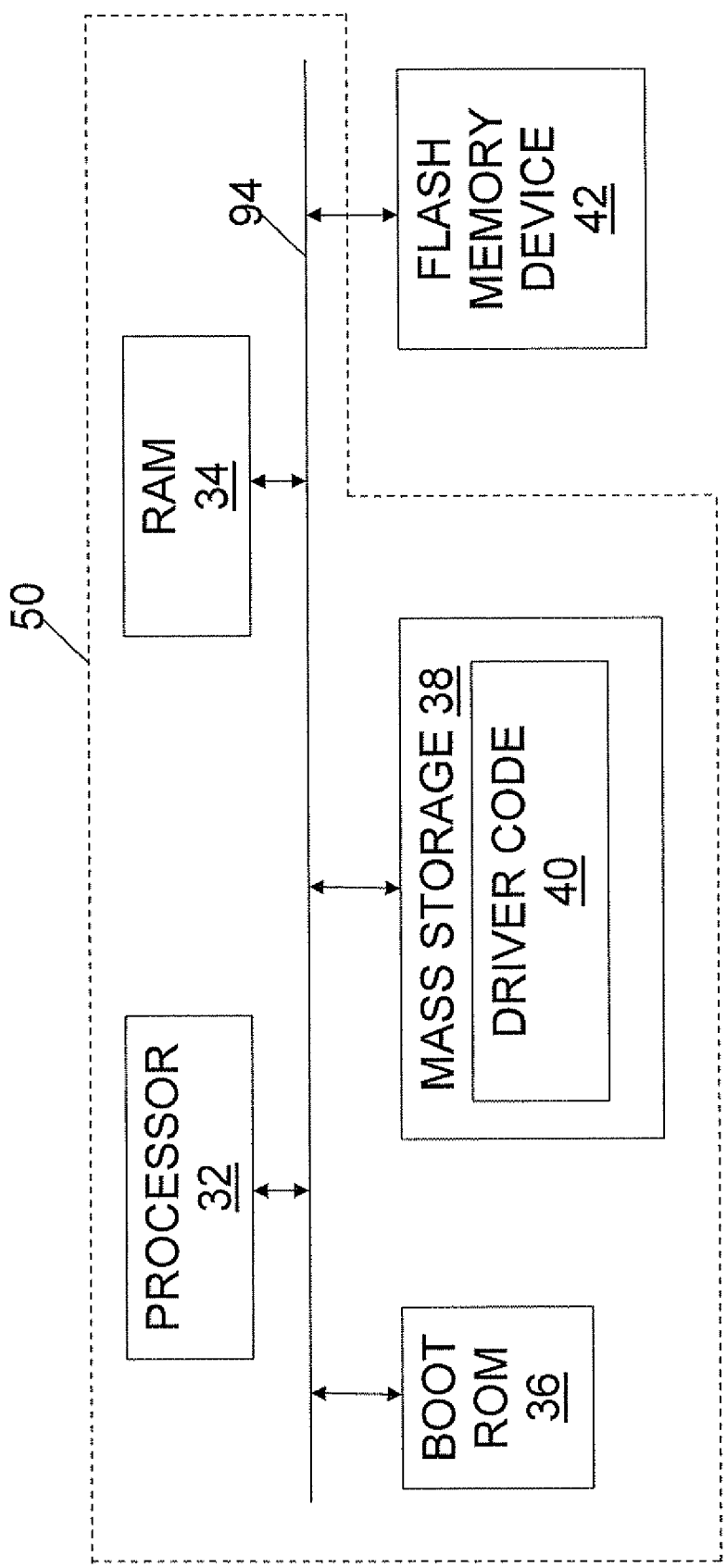
FIG. 8 is a high-level block diagram of a system of the present invention.

FIG. 8 is a high-level block diagram of a system 30 of the present invention. System 30 includes a processor 32 and four memory devices: a RAM 34, a boot ROM 36, a mass storage device (hard disk) 38 and a flash memory device 42, all communicating via a common bus 60. Flash memory device 42 is substantially identical to the portion of the flash memory device illustrated in FIG. 7 that is fabricated on circuit chip 21, with the functionality of controller 20 being emulated by flash memory driver code 40 that is stored in mass storage device 38 and that is executed by processor 32. Driver code 40 also interfaces between user applications executed by processor 32 and flash memory device 42. Driver code 40 typically is included in operating system code for system 30 but also could be freestanding code.

The components of system 30 other than flash memory device 42 constitute a host 50 of flash memory device 42. Mass storage device 38 is an example of a computer-readable storage medium bearing computer-readable driver code for implementing the present invention. Other examples of such computer-readable storage media include read-only memories such as CDs bearing such code.

While the invention has been described with respect to a limited number of embodiments, it will be appreciated that many variations, modifications and other applications of the invention may be made.

What is claimed is:

1. A method of programming and reading a plurality of flash memory cells, comprising the steps of:
   (a) programming each cell to a respective one of $L \geq 2$ threshold voltage states within a threshold voltage window;
   (b) reading said cells relative to a set of initial reference voltages that define $m \geq 2$ threshold voltage intervals that span said threshold voltage window;
   (c) based on said reading, for at least a portion of the cells, determining how many of the cells of said portion have respective threshold voltages in each of at least two of said threshold voltage intervals, thereby obtaining, for each of said at least two threshold voltage intervals, a corresponding number of cells of said at least portion;
   (d) adjusting a respective value of at least one parameter of at least one threshold voltage function to fit said at least one threshold voltage function to said numbers; and
   (e) based on said respective value of each said at least one parameter of said at least one threshold voltage function, and without reading said cells subsequent to said determining, assigning a respective one of said states to each cell of the plurality.

2. The method of claim 1, wherein $L > 2$.

3. The method of claim 1, wherein $m \geq L$.

4. The method of claim 1, wherein $m = L$.

5. The method of claim 1, wherein $m > L$.

6. The method of claim 5, wherein m is L multiplied by a positive integral power of 2.

7. The method of claim 1, wherein said determining is effected for all the cells.

8. The method of claim 1, wherein said determining is effected for all said threshold voltage intervals.

9. The method of claim 1, further comprising the step of:
   (e) based on said values, computing at least one new reference voltage, said assigning then being based on said at least one new reference voltage.

10. The method of claim 9, wherein $L-1$ said new reference voltages are computed.

11. The method of claim 9, wherein said computing is constrained by requiring each said at least one new reference voltage to be within a respective predetermined range.

12. The method of claim 1, wherein at least a predetermined number of the cells is programmed to each of said L threshold voltage states.

13. The method of claim 1, wherein substantially equal numbers of the cells are programmed to each of said L threshold voltage states.

14. The method of claim 1, wherein respective values of at least one parameter of each said threshold voltage function of a superposition of a plurality of said threshold voltage functions is adjusted to fit said superposition of said plurality of said threshold voltage functions to said numbers, said respective states of said cells then being assigned based on said values.

15. The method of claim 1, wherein each said threshold voltage function is a Gaussian.

16. The method of claim 1, wherein said adjusting is effected iteratively.

17. A memory device comprising:
   (a) a flash memory including:
      (i) a plurality of flash memory cells, and
      (ii) circuitry for:
         (A) programming each said cell to a respective one of $L \geq 2$ threshold voltage states within a threshold voltage window, and
         (B) reading said cells by comparing a respective threshold voltage of each said cell to at least one reference voltage; and
   (b) a controller for:
      (i) instructing said circuitry to read said cells relative to at least one initial set of said reference voltages that together define $m \geq 2$ threshold voltage intervals that span said threshold voltage window,
      (ii) for at least a portion of said cells, based on said reading relative to said at least one initial set of said reference voltages, determining how many said cells have respective said threshold voltages in each of at least two of said threshold voltage intervals, thereby obtaining, for each of said at least two threshold voltage intervals, a corresponding number of cells of said at least portion,
      (iii) adjusting a respective value of at least one parameter of at least one threshold voltage function to fit said at least one threshold voltage function to said numbers, and
      (iv) based on said respective value of each said at least one parameter of said at least one threshold voltage function, and without reading said cells subsequent to said determining, assigning a respective one of said states to each said cell of said plurality.

18. A system comprising:
   (a) a memory device including:
      (i) a plurality of flash memory cells, and
      (ii) circuitry for:
         (A) programming each said cell to a respective one of $L \geq 2$ threshold voltage states within a threshold voltage window, and
         (B) reading said cells by comparing a respective threshold voltage of each said cell to at least one reference voltage; and
   (b) a host, of said memory device, including:
      (i) a nonvolatile memory for storing a driver of said memory device, said driver including code for:
         (A) instructing said circuitry to read said cells relative to at least one initial set of said reference voltages that together define $m \geq 2$ threshold voltage intervals that span said threshold voltage window,
         (B) for at least a portion of said cells, based on said reading relative to said at least one initial set of said reference voltages, determining how many said cells have respective said threshold voltages in each of at least two of said threshold voltage intervals, thereby obtaining, for each of said at least two threshold voltage intervals, a corresponding number of cells of said at least portion,
         (C) adjusting a respective value of at least one parameter of at least one threshold voltage function to fit said at least one threshold voltage function to said numbers, and
         (D) based on said respective value of each said at least one parameter of said at least one threshold voltage function, and without reading said cells subsequent to said determining, assigning a respective one of said states to each said cell of said plurality, and
      (ii) a processor for executing said code of said driver.

19. A computer-readable storage medium having computer-readable code embedded thereon, the computer-readable code being driver code for a memory device that includes a plurality of flash memory cells and circuitry for:
- (a) programming each cell to a respective one of $L \geq 2$ threshold voltage states within a threshold voltage window, and
- (b) reading the cells by comparing a respective threshold voltage of each cell to at least one reference voltage, the computer-readable code comprising:
- (a) program code for instructing the circuitry to read the cells relative to at least one initial set of the reference voltages that together define $m \geq 2$ threshold voltage intervals that span the threshold voltage window;
- (b) program code for, for at least a portion of the cells, based on the reading relative to said initial set of the reference voltages, determining how many cells have respective threshold voltages in each of at least two of the threshold voltage intervals, thereby obtaining, for each of said at least two threshold voltage intervals, a corresponding number of cells of said at least portion;
- (c) program code for adjusting a respective value of at least one parameter of at least one threshold voltage function to fit said at least one threshold voltage function to said numbers; and
- (d) program code for assigning a respective one of the states to each cell of the plurality, based on said respective value of each said at least one parameter of said at least one threshold voltage function and without reading the cells subsequent to said determining.

20. The method of claim 1, wherein said at least one threshold voltage function is at least a portion of a voltage level distribution function of the cells.

\* \* \* \* \*

UNITED STATES PATENT AND TRADEMARK OFFICE
CERTIFICATE OF CORRECTION

PATENT NO. : 7,903,468 B2
APPLICATION NO. : 11/941945
DATED : March 8, 2011
INVENTOR(S) : Simon Litsyn et al.

It is certified that error appears in the above-identified patent and that said Letters Patent is hereby corrected as shown below:

Title Page,
Assignee (73) should be corrected as follows:
change
--Ramot At Telaviv University Ltd., Tel-Aviv (IL)--
to
"Ramot At Tel-Aviv University Ltd., Tel-Aviv (IL)"

Signed and Sealed this
Tenth Day of May, 2011

David J. Kappos
*Director of the United States Patent and Trademark Office*